United States Patent
Kuo et al.

(10) Patent No.: US 9,287,173 B2
(45) Date of Patent: Mar. 15, 2016

(54) THROUGH SILICON VIA AND PROCESS THEREOF

(71) Applicant: UNITED MICROELECTRONICS CORP., Hsin-Chu (TW)

(72) Inventors: Chien-Li Kuo, Hsinchu (TW); Chun-Hung Chen, Tainan (TW); Ming-Tse Lin, Hsinchu (TW); Yung-Chang Lin, Taichung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 23 days.

(21) Appl. No.: 13/900,565

(22) Filed: May 23, 2013

(65) Prior Publication Data

US 2014/0346645 A1 Nov. 27, 2014

(51) Int. Cl.
*H01L 21/768* (2006.01)
*H01L 23/48* (2006.01)

(52) U.S. Cl.
CPC .... *H01L 21/76898* (2013.01); *H01L 21/76877* (2013.01); *H01L 21/76885* (2013.01); *H01L 23/481* (2013.01); *H01L 2924/0002* (2013.01)

(58) Field of Classification Search
CPC .............................. H01L 21/768; H01L 23/48
USPC ......................................... 257/621; 438/653
See application file for complete search history.

(56) References Cited

U.S. PATENT DOCUMENTS

| | | |
|---|---|---|
| 3,150,299 A | 9/1964 | Noyce |
| 3,256,465 A | 6/1966 | Weissenstem |
| 3,323,198 A | 6/1967 | Shortes |
| 3,343,256 A | 9/1967 | Smith |
| 3,372,070 A | 3/1968 | Zuk |
| 3,462,650 A | 8/1969 | Hennings |
| 3,648,131 A | 3/1972 | Stuby |
| 4,394,712 A | 7/1983 | Anthony |
| 4,395,302 A | 7/1983 | Courduvelis |
| 4,616,247 A | 10/1986 | Chang |
| 4,773,972 A | 9/1988 | Mikkor |
| 4,939,568 A | 7/1990 | Kato |
| 5,214,000 A | 5/1993 | Chazan |
| 5,229,647 A | 7/1993 | Gnadinger |
| 5,286,926 A | 2/1994 | Kimura |
| 5,372,969 A | 12/1994 | Moslehi |
| 5,399,898 A | 3/1995 | Rostoker |
| 5,463,246 A | 10/1995 | Matsunami |
| 5,484,073 A | 1/1996 | Erickson |
| 5,502,333 A | 3/1996 | Bertin |
| 5,627,106 A | 5/1997 | Hsu |

(Continued)

*Primary Examiner* — Asok K Sarkar
*Assistant Examiner* — Dmitriy Yemelyanov
(74) *Attorney, Agent, or Firm* — Winston Hsu; Scott Margo

(57) ABSTRACT

A through silicon via includes a substrate and a conductive plug. The substrate has a hole in a side. The conductive plug is disposed in the hole, and the conductive plug having an upper part protruding from the side, wherein the upper part has a top part and a bottom part, and the top part is finer than the bottom part. Moreover, a through silicon via process formed said through silicon via is also provided, which includes the following step. A hole is formed in a substrate from a side. A first conductive material is formed to cover the hole and the side. A patterned photoresist is formed to cover the side but exposing the hole. A second conductive material is formed on the exposed first conductive material. The patterned photoresist is removed. The first conductive material on the side is removed to form a conductive plug in the hole.

6 Claims, 6 Drawing Sheets

(56) References Cited

U.S. PATENT DOCUMENTS

| | | |
|---|---|---|
| 5,793,115 A | 8/1998 | Zavracky |
| 5,977,640 A | 11/1999 | Bertin |
| 6,018,196 A | 1/2000 | Noddin |
| 6,143,616 A | 11/2000 | Geusic |
| 6,274,937 B1 | 8/2001 | Ahn |
| 6,309,956 B1 | 10/2001 | Chiang |
| 6,391,777 B1 | 5/2002 | Chen |
| 6,407,002 B1 | 6/2002 | Lin |
| 6,440,640 B1 | 8/2002 | Yang |
| 6,483,147 B1 | 11/2002 | Lin |
| 6,525,419 B1 | 2/2003 | Deeter |
| 6,548,891 B2 | 4/2003 | Mashino |
| 6,551,857 B2 | 4/2003 | Leedy |
| 6,627,985 B2 | 9/2003 | Huppenthal |
| 6,633,083 B2 | 10/2003 | Woo |
| 6,746,936 B1 | 6/2004 | Lee |
| 6,778,275 B2 | 8/2004 | Bowes |
| 6,800,930 B2 | 10/2004 | Jackson |
| 6,812,193 B2 | 11/2004 | Brigham |
| 6,831,013 B2 | 12/2004 | Tsai |
| 6,897,148 B2 | 5/2005 | Halahan |
| 6,924,551 B2 | 8/2005 | Rumer |
| 6,930,048 B1 | 8/2005 | Li |
| 7,034,401 B2 | 4/2006 | Savastiouk |
| 7,052,937 B2 | 5/2006 | Clevenger |
| 7,075,133 B1 | 7/2006 | Padmanabhan |
| 7,098,070 B2 | 8/2006 | Chen |
| 7,111,149 B2 | 9/2006 | Eilert |
| 7,166,913 B2 | 1/2007 | Chinthakindi |
| 7,222,420 B2 | 5/2007 | Moriizumi |
| 7,282,951 B2 | 10/2007 | Huppenthal |
| 7,323,785 B2 | 1/2008 | Uchiyama |
| 7,338,896 B2 | 3/2008 | Vanhaelemeersch |
| 7,402,515 B2 | 7/2008 | Arana |
| 7,432,592 B2 | 10/2008 | Shi |
| 7,531,415 B2 | 5/2009 | Kwok |
| 7,541,677 B2 | 6/2009 | Kawano |
| 7,564,115 B2 | 7/2009 | Chen |
| 7,598,607 B2 | 10/2009 | Chung |
| 7,633,165 B2 | 12/2009 | Hsu |
| 7,732,926 B2 | 6/2010 | Uchiyama |
| 7,795,735 B2 | 9/2010 | Hsu |
| 7,812,426 B2 | 10/2010 | Peng |
| 7,816,227 B2 | 10/2010 | Chen |
| 7,825,024 B2 | 11/2010 | Lin |
| 7,825,517 B2 | 11/2010 | Su |
| 7,843,064 B2 | 11/2010 | Kuo |
| 7,846,837 B2 | 12/2010 | Kuo |
| 7,851,346 B2 | 12/2010 | Lee |
| 7,928,534 B2 | 4/2011 | Hsu |
| 7,932,608 B2 | 4/2011 | Tseng |
| 7,939,941 B2 | 5/2011 | Chiou |
| 7,955,895 B2 | 6/2011 | Yang |
| 7,956,442 B2 | 6/2011 | Hsu |
| 7,969,013 B2 | 6/2011 | Chen |
| 8,026,592 B2 | 9/2011 | Yoon |
| 8,034,708 B2 | 10/2011 | Kuo |
| 8,049,327 B2 | 11/2011 | Kuo |
| 8,053,898 B2 | 11/2011 | Marcoux |
| 8,053,900 B2 | 11/2011 | Yu |
| 8,053,902 B2 | 11/2011 | Chen |
| 8,063,496 B2 | 11/2011 | Cheon |
| 8,552,548 B1 * | 10/2013 | Do et al. ............... 257/698 |
| 2001/0038972 A1 | 11/2001 | Lyons |
| 2004/0080041 A1 | 4/2004 | Kimura |
| 2004/0188817 A1 | 9/2004 | Hua |
| 2005/0112997 A1 | 5/2005 | Lin |
| 2005/0136635 A1 | 6/2005 | Savastiouk |
| 2005/0205991 A1 | 9/2005 | Chen |
| 2006/0035146 A1 | 2/2006 | Hayashi |
| 2006/0042834 A1 | 3/2006 | Lee |
| 2007/0117348 A1 | 5/2007 | Ramanathan |
| 2007/0126085 A1 | 6/2007 | Kawano |
| 2007/0190692 A1 | 8/2007 | Erturk |
| 2008/0073747 A1 | 3/2008 | Chao |
| 2008/0108193 A1 | 5/2008 | You |
| 2009/0127667 A1 | 5/2009 | Iwata |
| 2009/0134498 A1 | 5/2009 | Ikeda |
| 2009/0180257 A1 | 7/2009 | Park |
| 2009/0224405 A1 | 9/2009 | Chiou |
| 2010/0001379 A1 | 1/2010 | Lee |
| 2010/0090317 A1 * | 4/2010 | Zimmermann et al. ...... 257/621 |
| 2010/0140749 A1 | 6/2010 | Kuo |
| 2010/0140772 A1 | 6/2010 | Lin |
| 2010/0178761 A1 * | 7/2010 | Chen .............. H01L 21/76898 438/613 |
| 2010/0244247 A1 | 9/2010 | Chang |
| 2010/0323478 A1 | 12/2010 | Kuo |
| 2011/0316168 A1 * | 12/2011 | Moon et al. ................ 257/774 |
| 2013/0175673 A1 * | 7/2013 | Jin et al. ..................... 257/621 |

\* cited by examiner

THROUGH SILICON VIA AND PROCESS THEREOF

BACKGROUND OF THE INVENTION

1. Field of the Invention

The present invention relates generally to a through silicon via and a process thereof, and more specifically to a through silicon via and a process thereof that forms a conductive filling material in a hole before a photoresist is formed.

2. Description of the Prior Art

The through-silicon via technique is a quite novel semiconductor technique. The through-silicon via technique mainly consists in solving the problem of the electrical interconnection of chips and belongs to a new 3D packing field. The hot through-silicon via technique creates products which meet the market trends of "light, thin, short and small" better thanks to 3D stacking through the through-silicon via, so as to provide the micro electronic mechanic system (MEMS), the photoelectronic and electronic elements with packing techniques of a wafer-level package.

The through-silicon via technique drills holes in the wafer by etching or by laser then fills the holes with conductive materials, such as copper, polysilicon or tungsten to form vias, i.e. conductive channels connecting inner regions and outer regions. At last, the wafer or the dice is thinned to be stacked or bonded together to be a 3D stack IC. In such a way, the wire bonding procedure may be omitted. Using etching or laser processes to form conductive vias not only avoids the wire bonding but also shrinks the occupied area on the circuit board and the overall volume for packing.

When comparing the inner connection distance of the package by the through-silicon via technique, i.e. the thickness of the thinned wafer or the dice, with the conventional stack package of wire bonding type, the 3D stack IC shows much shorter inner connection distances, so the 3D stack IC performs better in many ways, such as providing a smaller electrical resistance, faster transmissions, lower noise and better performances. The advantages of the shorter inner connection distance of the through-silicon via technique are much more outstanding, especially for the CPU, the flash memories and the memory cards. In addition, the package size of the 3D stack IC equals the size of the dice, so the through-silicon via technique is more valuable in the portable electronic devices.

However, as the miniaturization of semiconductor components increase, the depth/width aspect ratio of a through silicon via in these semiconductor components become higher, leading to the difficulties for forming the through silicon via.

SUMMARY OF THE INVENTION

The present invention provides a through silicon via and process thereof that fills a conductive material into a hole for forming parts of the through silicon via before a photoresist is formed to reduce the depth to be filled by the photoresist.

The present invention provides a through silicon via including a substrate and a conductive plug. The substrate has a hole in a side. The conductive plug is disposed in the hole, and the conductive plug has an upper part protruding from the side, wherein the upper part has a top part and a bottom part, and the top part is finer than the bottom part.

The present invention provides a through silicon via process including the following steps. A substrate having a side is provided. A hole is formed in the substrate from the side. A first conductive material is formed to cover the hole and the side. A patterned photoresist is formed to cover the side but exposing the hole. A second conductive material is formed on the exposed first conductive material. The patterned photoresist is removed. The first conductive material on the side is removed to form a conductive plug in the hole.

According to the above, the present invention provides a through silicon via and process thereof, that fills a first conductive material into a hole of a substrate before a patterned photoresist is formed. Therefore, the photoresist filled into the hole can be removed easily while patterning because the depth to be filled by the photoresist has been reduced. Moreover, after the patterned photoresist is formed, a second conductive material is filled into the hole on the first conductive material, and then the patterned photoresist is removed, the part of the first conductive material outside the hole is removed to form a conductive plug. Due to the first conductive material outside the hole being removed by methods such as etching, an upper part of the conductive plug protruding from the substrate can have a top part finer than a bottom part.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
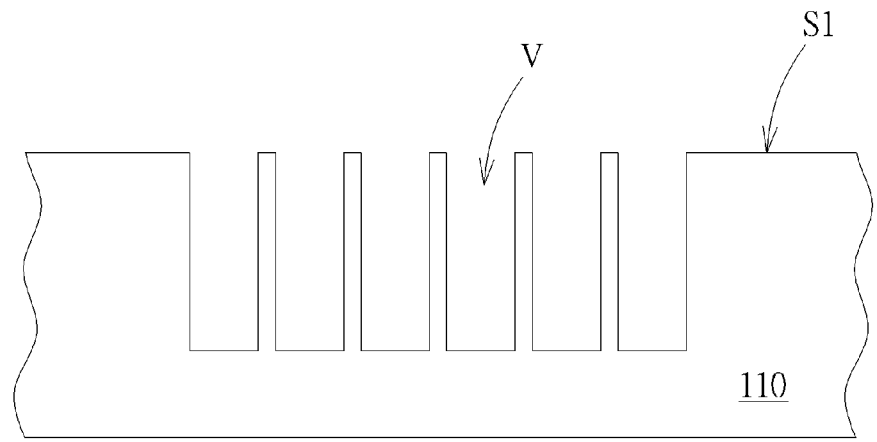
FIG. 1 schematically depicts a cross-sectional view of a through silicon via process according to an embodiment of the present invention.

FIG. 1 schematically depicts a cross-sectional view of a through silicon via process according to an embodiment of the present invention. As shown in FIG. 1, a substrate 110 having holes V is provided. In this embodiment, the holes V are formed in a side S1 of the substrate 110, wherein the side S1 may be a side opposite to or on the same side as an active side, but it is not limited thereto. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. Generally, the holes V are formed through etching, but it is not limited thereto. The holes V have a high depth/width ratio for forming a through silicon via structure. For example, the holes V have an aspect ratio comprised in a range of 3.5~10, and the critical dimension of the holes is less than 18 μm, but it is not limited thereto.

There are two embodiments presented in the following paragraphs that continue from the steps shown in FIG. 1 to form through silicon vias.

Figure 2:
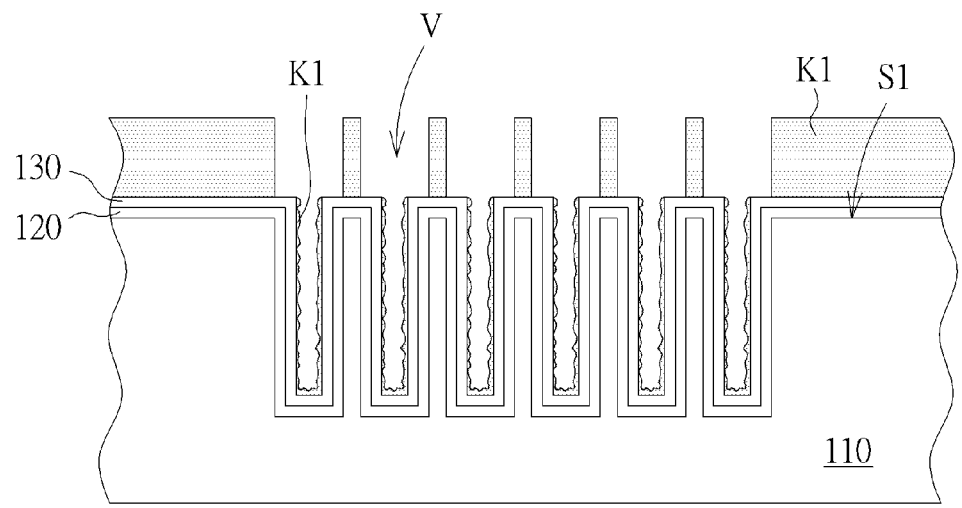
FIGS. 2-4 schematically depict cross-sectional views of a through silicon via process according to a first embodiment of the present invention.
Figure 3:
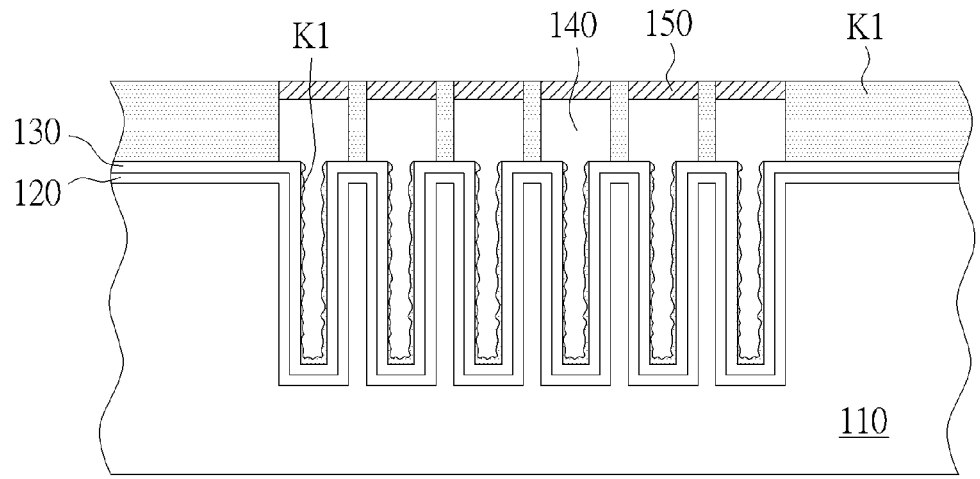
Figure 4:
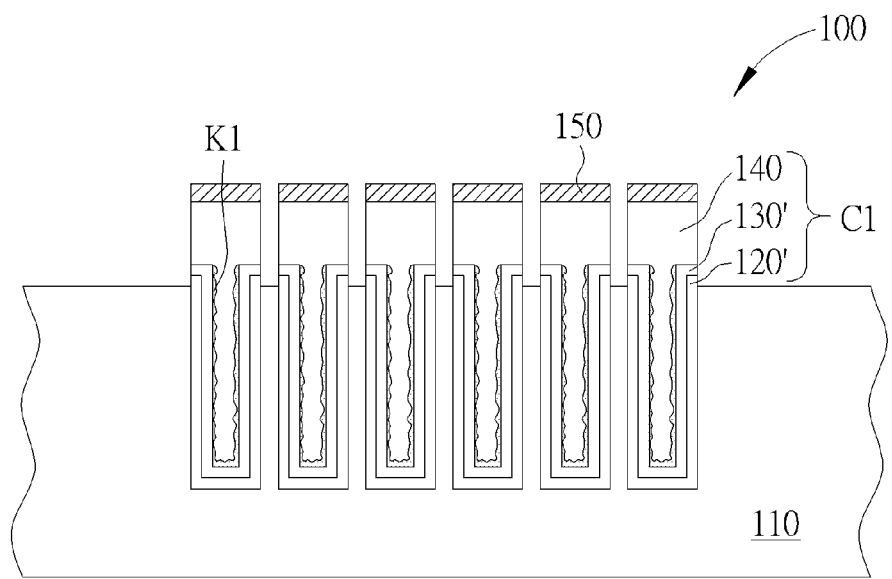

FIGS. 2-4 schematically depict cross-sectional views of a through silicon via process according to a first embodiment of the present invention. As shown in FIG. 2, a liner (not shown) may be selectively formed to conformally cover the substrate 110. The liner may be an oxide layer to electrically isolate the substrate 110, but it is not limited thereto. A barrier layer 120 is formed on the liner. The barrier layer 120 may include a single or multilayer structure composed of a titanium nitride layer or a tantalum nitride layer etc.

Thereafter, a seeding layer 130 may be selectively formed on the barrier layer 120. The seeding layer 130 may be formed by a physical vapor deposition (PVD) process to be used as a layer adhesive by a main conductive material later formed thereon, but it is not limited thereto. A patterned photoresist K1 is formed to cover the side S1 but exposing the holes V. More precisely, a photoresist (not shown) may be formed to entirely cover the side S1 and fill into at least a part of the holes V. Then, the photoresist is patterned to cover the side S1 but exposing the holes V.

As shown in FIG. 3, a main conductive material 140 is filled into the exposed holes V and formed on part of the seeding layer 130. The main conductive material 140 may be formed by Copper (Cu), and may be formed by methods such as electroplating, but it is not limited thereto. Then, a conductor 150 is formed on the main conductive material 140. The conductor 150 may be nickel, tin or gold and may be formed by pressing, but it is not limited thereto.

Thereafter, the patterned photoresist K1 is removed, and the exposed part of the seeding layer 130 and the barrier layer 120 right below the patterned photoresist K1 is also removed to form a seeding layer 130' and a barrier layer 120', as shown in FIG. 4. The patterned photoresist K1 and the part of the seeding layer 130 and the barrier layer 120 may be removed in the same process or in sequential processes such as etching processes or etc. Thus, conductive plugs C1 including the barrier layer 120', the seeding layer 130' and the main conductive material 140 are formed in the holes V.

Above all, a through silicon via 100 including the conductive plugs C1 and the conductor 150 is formed in the holes V of the substrate 110. However, due to the holes V for forming the through silicon via 100 having an aspect ratio comprised in a range of 3.5~10 while the critical dimension of the hole is smaller than 18 μm, the step of forming the patterned photoresist K1 has an extremely difficult problem. That is, when the photoresist is formed, it also fills the holes V; and, when the photoresist is patterned to form the patterned photoresist K1, the photoresist in the holes V is hard to be removed because of the capillary phenomenon occurring seriously when the holes V have a high aspect ratio.

Thus, a second embodiment is presented in the following to solve this problem, so that an improved through silicon via can be formed. FIGS. 5-10 schematically depict cross-sectional views of a through silicon via process according to a second embodiment of the present invention.

Figure 5:
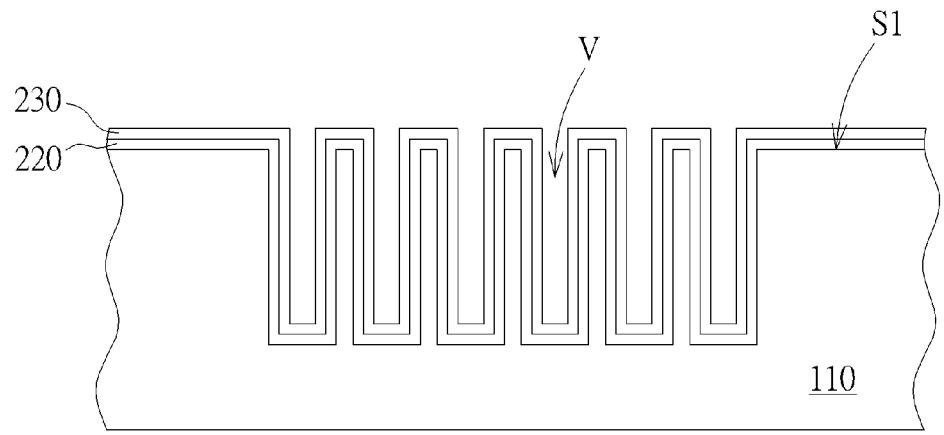
FIGS. 5-10 schematically depict cross-sectional views of a through silicon via process according to a second embodiment of the present invention.

Please refer to FIG. 5 after the step described in FIG. 1, a liner (not shown) may be selectively formed to conformally cover the substrate 110. The liner may be an oxide layer to electrically isolate the substrate 110, but it is not limited thereto. A barrier layer 220 and a seeding layer 230 are sequentially formed to cover the holes V and the side S1. The barrier layer 220 may include a single or a multilayer structure composed of a titanium nitride layer or a tantalum nitride layer etc. The seeding layer 230 may be copper, and may be formed through a physical vapor deposition (PVD) process to be used as a layer adhesive by a conductive material later formed thereon, but it is not limited thereto.

Figure 6:
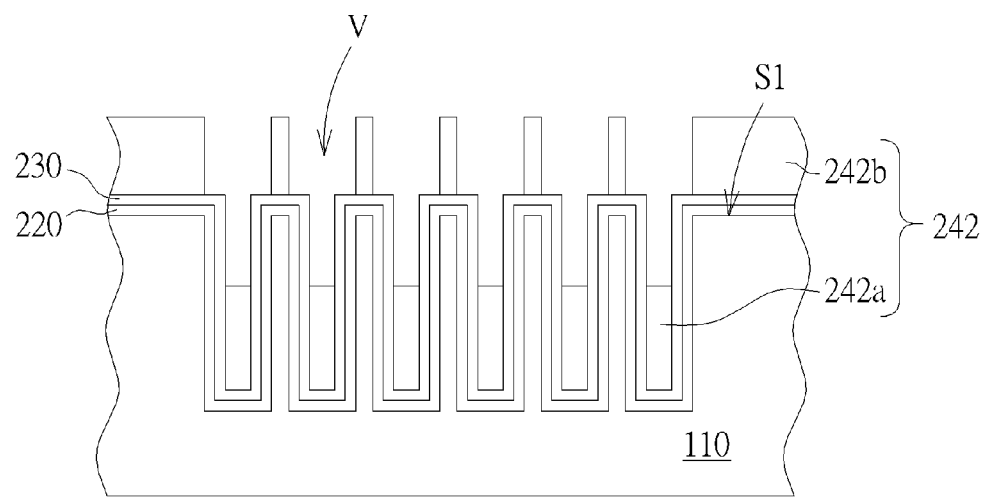

As shown in FIG. 6, a first conductive material 242 is formed to cover the holes V and the side S1, so that the first conductive material 242 includes a hole part 242a in the holes V and a side part 242b on the side S1. The first conductive material 242 may be copper, and may be formed by plating, but it is not limited thereto. Preferably, the first conductive material 242 is formed until the aspect ratio of the remaining hole is lower than 3. Still preferably, the first conductive material 242 is formed until the aspect ratio of the remaining hole is 2.5. In this way, the aspect ratio of the remaining hole can be lower than 3, and a later formed photoresist filling into the holes V can be removed easily.

Figure 7:
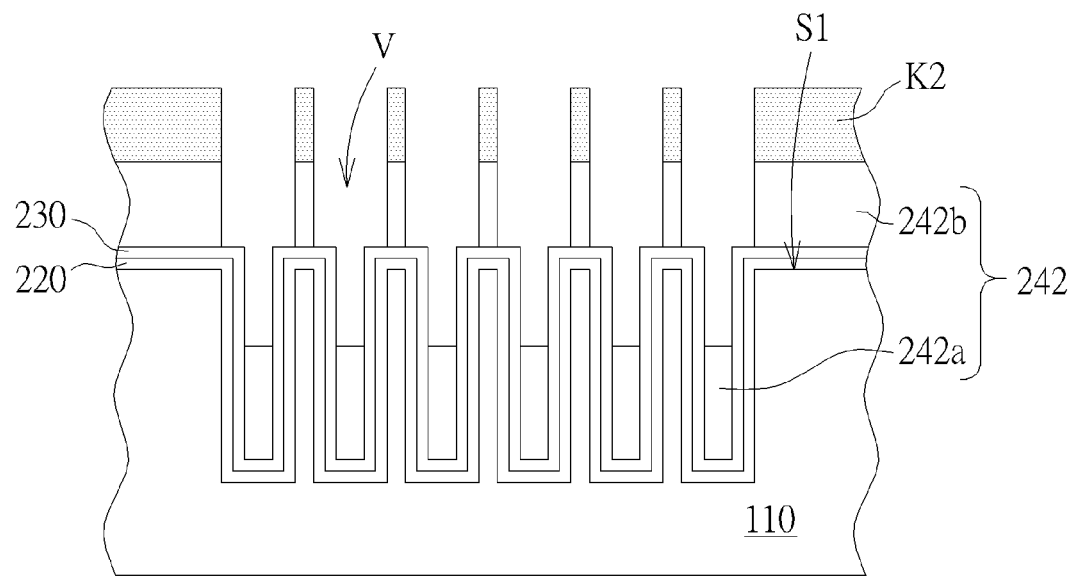

As shown in FIG. 7, a patterned photoresist K2 is formed to cover the side S1 but exposing the holes V. More precisely, a photoresist (not shown) may be formed to entirely cover the side S1 and fill into at least a part of the holes V. Then, the photoresist is patterned to cover the side S1 but exposing the holes V. Thereafter, an $O_2$ treatment process may be selectively performed to further remove the residues of the photoresist in the holes V after the patterned photoresist K2 is formed. Thanks to the hole part 242a of the first conductive material 242 being filled into the holes V until its aspect ratio is lower than 3, the photoresist can be removed completely while the patterning.

Figure 8:
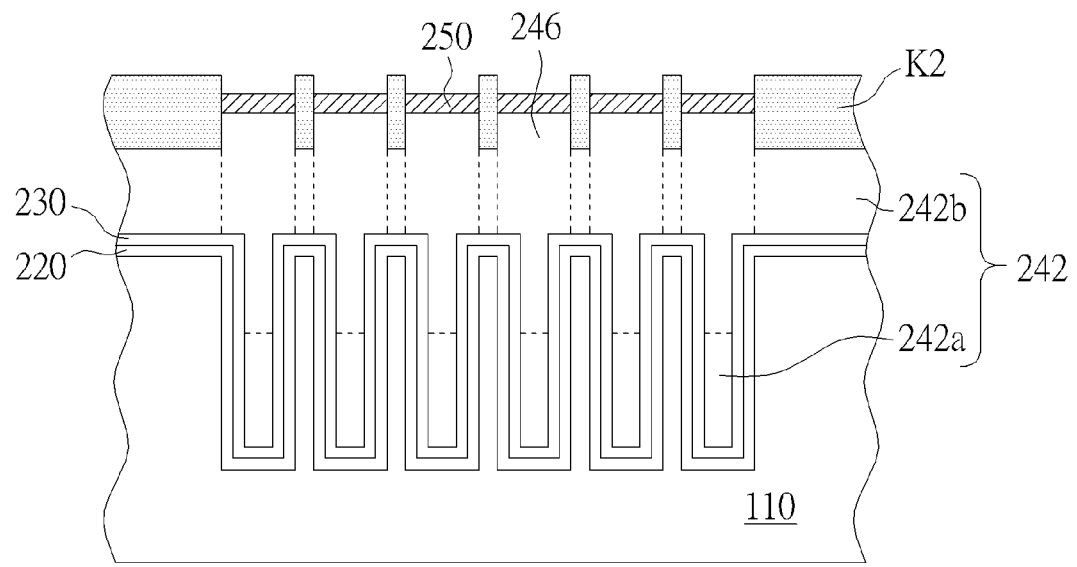

As shown in FIG. 8, a second conductive material 246 is formed on the exposed hole part 242a of the first conductive material 242. The second conductive material 246 may be copper, and may be formed by plating, but it is not limited thereto. Then, a conductor 250 is formed on the second conductive material 246. The conductor 250 may be nickel, tin or gold and may be formed by pressing, but it is not limited thereto.

Figure 9:
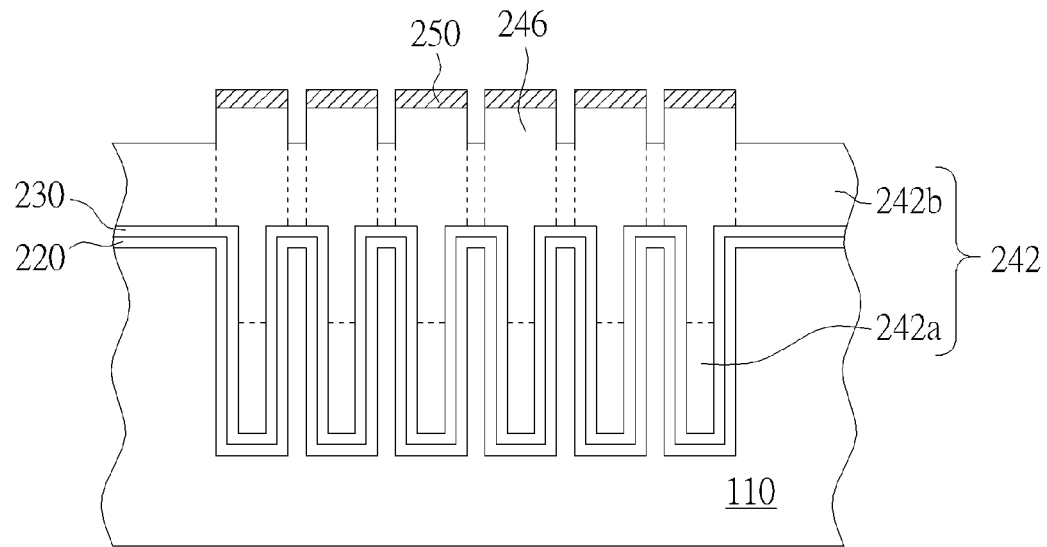
Figure 10:
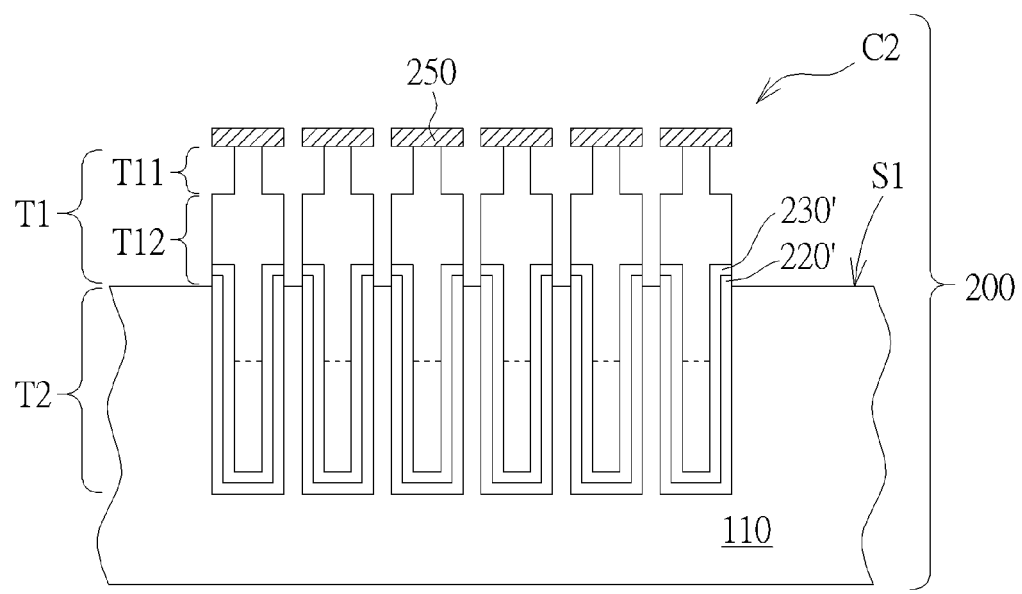

The patterned photoresist K2 is removed and the side part 242b of the first conductive material 242 is therefore exposed, as shown in FIG. 9. Then, an etching process may be performed to remove the side part 242b of the first conductive material 242, as shown in FIG. 10. In this embodiment, the etching process is performed to remove the side part 242b by serving the conductor 250 as a hard mask. In the meanwhile, the part of the barrier layer 220 and the seeding layer 230 on the side S1 or right below the side part 242b are also removed, and a barrier layer 220' and a seeding layer 230' are therefore formed. The side part 242b, the part of the barrier layer 220 and the seeding layer 230 may be removed by the same process or sequential processes. Thus, conductive plugs C2 including the barrier layer 220', the seeding layer 230', the first conductive material 242 and the second conductive material 246 are formed in the holes V. The conductive plugs C2 are made of copper, but it is not limited thereto. Therefore, a through silicon via 200 including conductive plugs C2 and the conductor 250 is formed in the holes V of the substrate 110.

Each of the conductive plugs C2 has an upper part T1 and a lower part T2, wherein the upper part T1 protrudes from the side S1 while the lower part T2 is under the upper part T1. It is emphasized that when the side part 242b of the first conductive material 242 is removed by using the conductor 250 as a hard mask, a top part T11 of the upper part T1 higher than the side part 242b of the first conductive material 242 is also etched while a bottom part T12 of the upper part T1 on the same level as the side part 242b of the first conductive material 242 is not etched because of the sheltering of the side part 242b. As a result, the top part T11 is finer than the bottom part T12. The top part T11 is also finer than the conductor 250 as the conductor 250 serves as a hard mask for the etching. Preferably, the conductor 250 has the same diameter as the bottom part T12, so that the conductive plugs C2 will not merge together and short circuit each other as each of the conductive plugs C2 are disposed closely, thereby allowing the layout of semiconductor components formed by this through silicon via 200 to be easier to control. Even more, the bottom part T12 has the same diameter as the lower part T2 to constitute a refined through silicon via 200 having good conductivity.

The through silicon via 200 has six conductive plugs C2 in respectively six holes V. However, the number of the conductive plugs C2 is not restrict to this, and may be less or more than six. In other words, the through silicon via 200 may have just one conductive plug C2, and the through silicon via 200 and process thereof of the present invention can be applied to various through silicon via processes, such as a via last process. There are two embodiments using the through silicon via 200 and process thereof of the present invention into various through silicon via processes, but the applications of the present invention are not restricted to these embodiments.

Figure 11:
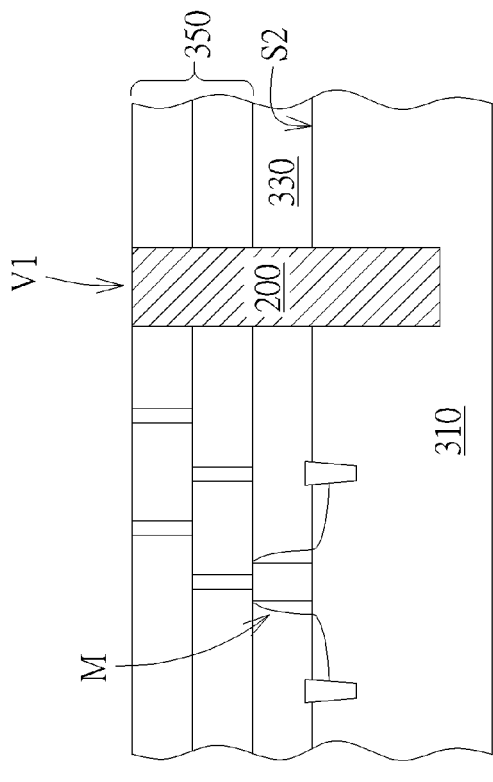
FIG. 11 schematically depicts a cross-sectional view of a through silicon via process according to an embodiment of the present invention.

As shown in FIG. 11, the steps of a via last process after metal interconnects are formed include the following. A MOS transistor M is formed on a substrate 310 (as shown in the left diagram), and an interdielectric layer 330 and a multilayer interconnect structure 350 are formed; then, a hole V1 is formed in the multilayer interconnect structure 350, the interdielectric layer 330 and the substrate 310 from a front side S2 of the substrate 310, and a through silicon via 200 may be formed (as shown in the right diagram).

Figure 12:
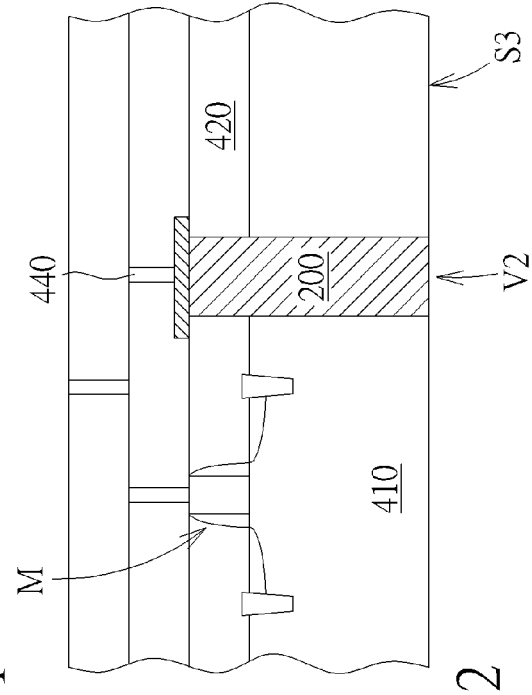
FIG. 12 schematically depicts a cross-sectional view of a through silicon via process according to an embodiment of the present invention.

As shown in FIG. 12, the steps of a via last process after the MOS transistors are formed and before the metal interconnects are formed includes the following. The fabrication of semiconductor structures such as a MOS transistor M on a substrate 410 is finished (as shown in the left diagram); an interdielectric layer 420 and a multilayer interconnect structure 440 are formed, the substrate 410 is thinned down, a hole V2 is formed through the substrate 410 and an interdielectric layer 420 from a back side S3 of the substrate 410, and a through silicon via 200 may be formed to connect with metals such as the multilayer interconnect structure 440 (as shown in the right diagram).

To summarize, the present invention provides a through silicon via and a process thereof, that fills a first conductive material into a hole of a substrate before a patterned photoresist formed by covering and patterning is formed. Therefore, the photoresist filling the hole can be removed easily during the patterning because the depth to be filled by the photoresist is reduced. Preferably, the aspect ratio of the remaining hole after the first conductive material being filled is lower than 3.

Moreover, after the patterned photoresist is formed, a second conductive material is filled into the holes on the first conductive material, a conductor is formed on the second conductive material, and then the patterned photoresist is removed, the part of the first conductive material outside the holes is removed to form conductive plugs. Due to the first conductive material outside the holes being removed by methods such as etching, an upper part of each of the conductive plugs protruding from the substrate has a top part finer than a bottom part. Preferably, the conductor serves as a hard mask while etching the first conductive material, so that the top part is also finer than the conductor. Still preferably, the conductor has the same diameter as the bottom part, so that the conductive plugs will not merge together and short circuit each other as adjacent conductive plugs disposed closely. Even more, the bottom part has the same diameter as a lower part of each of the conductive plugs in the holes, so a refined through silicon via having good conductivity can be constituted.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A through silicon via, comprising:
a substrate having a hole in a side;
a conductive plug comprising a barrier layer having a U-shaped cross-sectional profile and a seeding layer covering two ends of the U-shaped cross-sectional profile disposed in the hole, and the conductive plug having an upper part with all of the upper part protruding from the side, wherein the upper part has a top part and a bottom part, the top part is finer than the bottom part, and the bottom part has the same diameter as a lower part of the conductive plug in the hole; and
a conductor disposed on the conductive plug, wherein the conductor has the same diameter as the whole bottom part, and directly contacts the top part.

2. The through silicon via according to claim 1, wherein the conductive plug comprises copper.

3. The through silicon via according to claim 1, wherein the conductor comprises nickel, tin or gold.

4. The through silicon via according to claim 1, wherein the top part is finer than the conductor.

5. The through silicon via according to claim 1, wherein the critical dimension of the hole is less than 18 µm.

6. A through silicon via, comprising:
a substrate having a hole in a side; and
a conductive plug comprising a barrier layer and a second conductive material disposed in the hole, the conductive plug having an upper part with all of the upper part protruding from the side, wherein the upper part has a top part having a rectangular cross-sectional profile and a bottom part having the second conductive material covering the barrier layer, the connection of the top part and the bottom part has a L-shaped cross-sectional profile corner and the top part is finer than the bottom part.

* * * * *